(12) United States Patent
Li et al.

(10) Patent No.: US 12,334,440 B2
(45) Date of Patent: Jun. 17, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Yongxiang Li, Hefei (CN); Min-Hui Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 390 days.

(21) Appl. No.: 17/887,775

(22) Filed: Aug. 15, 2022

(65) Prior Publication Data

US 2023/0387008 A1 Nov. 30, 2023

Related U.S. Application Data

(63) Continuation of application No. PCT/CN2022/098145, filed on Jun. 10, 2022.

(30) Foreign Application Priority Data

May 30, 2022 (CN) .......................... 202210598976.8

(51) Int. Cl.
*H01L 23/528* (2006.01)
*H01L 21/265* (2006.01)
(Continued)

(52) U.S. Cl.
CPC .... *H01L 23/5283* (2013.01); *H01L 21/26506* (2013.01); *H01L 21/30604* (2013.01);
(Continued)

(58) Field of Classification Search
CPC ........... H01L 23/5283; H01L 21/26506; H01L 21/30604; H01L 21/76816;
(Continued)

(56) References Cited

U.S. PATENT DOCUMENTS

| 6,018,174 A | 1/2000 | Schrems |
|---|---|---|
| 7,316,952 B2 | 1/2008 | Lee |

(Continued)

FOREIGN PATENT DOCUMENTS

| CN | 1252624 A | 5/2000 |
|---|---|---|
| CN | 108110005 A | 6/2018 |

(Continued)

OTHER PUBLICATIONS

English translation of "CN 114068702 A" Guo et al., "A Buried Gate Transistor And Manufacturing Method Thereof, Feb. 18, 2022" (Year: 2022).*

(Continued)

*Primary Examiner* — Eva Y Montalvo
*Assistant Examiner* — Nicholas B Michaud
(74) *Attorney, Agent, or Firm* — Kilpatrick Townsend & Stockton LLP

(57) ABSTRACT

A semiconductor structure and a manufacturing method thereof are provided. The manufacturing method includes: providing a substrate; forming an ion implantation area in the substrate, an upper surface of the ion implantation area having a distance from an upper surface of the substrate; forming an initial word line trench in the substrate, the initial word line trench extending from the upper surface of the substrate into the ion implantation area; widening the initial word line trench to form a word line trench, a width of a bottom of the word line trench being greater than a minimum width of the word line trench.

13 Claims, 15 Drawing Sheets

(51) Int. Cl.
  *H01L 21/306* (2006.01)
  *H01L 21/768* (2006.01)
  *H10B 12/00* (2023.01)

(52) U.S. Cl.
  CPC ..... *H01L 21/76816* (2013.01); *H10B 12/053* (2023.02); *H10B 12/34* (2023.02); *H10B 12/488* (2023.02)

(58) Field of Classification Search
  CPC .......... H01L 21/02238; H01L 29/4236; H01L 29/42376; H01L 29/0684; H10B 12/053; H10B 12/34; H10B 12/488; H10B 12/30
  USPC ........ 257/774, 345, 607, 610; 438/259, 270, 438/305, 306, 589, 700
  See application file for complete search history.

(56) References Cited

U.S. PATENT DOCUMENTS

| | | | |
|---|---|---|---|
| 7,316,953 B2 | 1/2008 | Lee | |
| 11,196,001 B2 | 12/2021 | Miao | |
| 2002/0197813 A1* | 12/2002 | Kim | H01L 28/91 257/E21.252 |
| 2008/0026487 A1* | 1/2008 | Feustel | H01L 21/26506 257/E21.252 |
| 2008/0073709 A1 | 3/2008 | Fujimoto et al. | |
| 2008/0303086 A1* | 12/2008 | Ueda | H01L 29/66621 438/270 |
| 2009/0267126 A1 | 10/2009 | Wang et al. | |
| 2012/0256256 A1 | 10/2012 | Wu et al. | |
| 2021/0159409 A1 | 5/2021 | Miao et al. | |
| 2022/0013524 A1 | 1/2022 | Ryu et al. | |

FOREIGN PATENT DOCUMENTS

| | | | |
|---|---|---|---|
| CN | 110970346 A | | 4/2020 |
| CN | 111211122 A | | 5/2020 |
| CN | 113903741 A | | 1/2022 |
| CN | 114068702 A | * 2/2022 | ........... H10B 12/053 |
| CN | 114446964 A | | 5/2022 |
| EP | 0967644 A2 | | 12/1999 |
| JP | 2008277826 A | | 11/2008 |
| JP | 2009224520 A | | 10/2009 |
| TW | 200426999 A | | 12/2004 |

OTHER PUBLICATIONS

European Patent Office, Extended European Search Report Issued in Application No. 22754758.5, May 28, 2024, Germany, 9 pages.
International Search Report cited in PCT/CN2022/098145, mailed on Feb. 22, 2023, 3 pages.
Korean Intellectual Property Office, First Office Action Issued in Application No. 10-2022-7032120, Feb. 26, 2024, 13 pages.
First Office Action of the Taiwanese application No. 111132997, issued on Aug. 28, 2023. 6 pages with English abstract.
Japanese Patent Office, Office Action Issued in Application No. 2022-551314, Aug. 27, 2024, 7 pages.

* cited by examiner

SEMICONDUCTOR STRUCTURE AND MANUFACTURING METHOD THEREOF

CROSS-REFERENCE TO RELATED APPLICATIONS

The application is a continuation application of International Application No. PCT/CN2022/098145, filed on Jun. 10, 2022, which claims priority to Chinese Patent Application No. 202210598976.8, filed on May 30, 2022. The disclosures of International Application No. PCT/CN2022/098145 and Chinese Patent Application No. 202210598976.8 are incorporated herein by reference in their entireties.

BACKGROUND

As semiconductor memory devices (such as dynamic random access memory, abbreviated as DRAM) become highly integrated, the area of an unit cell on the semiconductor substrate will gradually decrease accordingly, and the length of the channel contained in a metal oxide semiconductor (MOS) transistor will gradually decrease, which will be prone to leading to short channel effect.

In order to maintain the high integration of the semiconductor memory devices, in the current mainstream DRAM technology, an MOS with buried word lines (BWs) is used in the memory cell transistor, which can reduce the short channel effect to a certain extent, and thus reduce the leakage phenomenon of devices.

However, as the size of the memory cell decreases, the size of a BW trench will also decrease, and then the cross-sectional area of the metal filled in the BW trench will also decrease; this will lead to an increase in the resistance of the word line (WL), resulting in more power consumption and aggravation of the signal delay (RC delay for short) caused by the charging and discharging process of the resistor (R) parasitic capacitance (C).

SUMMARY

The disclosure relates to the technical field of semiconductor manufacture, in particular to a semiconductor structure and a manufacturing method thereof.

According to some embodiments, a first aspect of the embodiments of the disclosure provides a manufacturing method of a semiconductor structure, and the manufacturing method includes: providing a substrate; forming an ion implantation area in the substrate, an upper surface of the ion implantation area having a distance from an upper surface of the substrate; forming an initial word line trench in the substrate; the initial word line trench extending from the upper surface of the substrate into the ion implantation area; and widening the initial word line trench to form a word line trench; a width of a bottom of the word line trench being greater than a minimum width of the word line trench.

According to some embodiments, another aspect of the embodiments of the disclosure provide a semiconductor structure, and the semiconductor structure includes: a substrate, a first doped area and a second doped area being provided in the substrate, the second doped area extending from a upper surface of the substrate into the substrate, the first doped area being located below the second doped area, the first doped area being a doped area of a first conductive type, and the second doped area being a doped area of a second conductive type; and a word line trench, the word line trench penetrating the second doped area and extending into the first doped area, and a width of a bottom of the word line trench being greater than a minimum width of the word line trench.

The details of one or more embodiments of the disclosure are set forth in the drawings and the description below. Other features, objects and advantages of the embodiments of the disclosure will be apparent from the description, drawings and the claims.

BRIEF DESCRIPTION OF THE DRAWINGS

In order to more clearly illustrate the technical solutions of the embodiments of the disclosure, a brief description of the drawings required to be used in the description of the embodiments will be provided below. Apparently, the drawings in the following description are merely some embodiments of the disclosure. For a person of ordinary skill in the art, other drawings can be obtained based on these drawings without creative work.

FIG. 13 also is a cross-sectional structure diagram of a semiconductor structure provided by an embodiment of the present disclosure;

DETAILED DESCRIPTION

Figure 1:
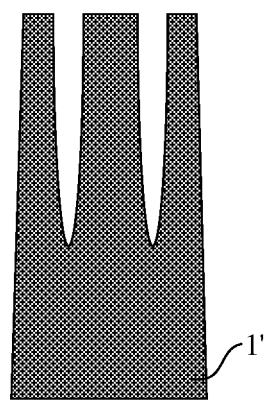
FIG. 1 is a cross-sectional structure diagram of a structure obtained by dry etching to form a chevron trench of a buried word line in a buried word line process.

In order to facilitate to understand the embodiments of the present disclosure, a more complete description will be provided below with reference to the relative accompanying drawings. Preferred embodiments of the present disclosure are provided in the accompanying drawings. However the embodiments of the present disclosure may be implemented in many different forms and is not limited to the embodiments described herein. Rather these embodiments are provided so that the disclosure of the embodiments of the present disclosure will be more thoroughly and comprehensively understood.

Unless otherwise defined, all technical and scientific terms used herein have the same meanings as those commonly understood by those skilled in the art of the present disclosure. Terms used herein in the specification of the present disclosure are for the purpose of describing specific embodiments only and are not intended to limit the present disclosure.

It should be understood that when an element or a layer is referred to as "on" another element or layer, it may be directly on the other element or layer, or there may be an intermediate element or layer therebetween. It should be understood that although the terms "first", "second" and the like may be used to describe various elements, components, regions, layers, doped types and/or portions, these elements, components, regions, layers, doped types and/or portions should not be limited by these terms. These terms are only used to distinguish one element, component, region, layer, doped types or terms are only used to distinguish one element, component, region, layer, doping type or portion from another element, component, region, layer, doped types or portion. Accordingly, without departing from the teachings of the embodiments of the disclosure, the first element, component, region, layer, doped type, or portion discussed below may be represented as a second element, component, region, layer, or portion; for example the first doped area may be referred to as the second doped area and similarly the second doped area may be referred to as the first doped area. The first doped area and the second doped area are different doped areas, for example, the first doped area may be a doped area of the first conductive type and the second doped area may be a doped area of the second conductive type, or the first doped area may be a doped area of the second conductive type and the second doped area may be a doped area of the first conductive type.

Spatial relationship terms such as "below", "above" may be used herein to describe a relationship between one element or feature and another element or feature shown in the drawings. It should be understood, the spatial relationship terms further include different orientations of a device in use and operation in addition to the orientations shown in the drawings. For example, if the device in the drawing is turned over, an element or feature described as being "below" another element will be oriented as being "above" another element or feature. Therefore, the exemplary terms "above" may include up and down orientations. In addition, the device may also include additional orientations (e.g., rotation for 90 degrees or other orientations), and the spatial terms used herein are interpreted accordingly.

As used herein, the singular forms "a/an", "one", and "the/said" may also include the plural forms as well, unless the context clearly dictates otherwise. It should be further understood that when terms "consist of" and/or "comprise/include" used in the specification, the presence of the stated features, integers, steps, operations, elements and/or components can be determined, but the presence or addition of one or more of other features, integers, steps, operations, elements, components and/or combinations is not excluded. Meanwhile, as used herein, the term "and/or" includes any of the listed items and all combinations thereof.

Embodiments of the disclosure are described herein with reference to cross-sectional views of schematic diagrams of ideal embodiments (and intermediate structures) as embodiments of the present disclosure, so that variations of the illustrated shape caused by, for example, manufacturing techniques and/or tolerances can be anticipated. Thus, embodiments of the present disclosure should not be limited to the specific shape of the areas shown herein but include shape deviations caused by for example manufacturing techniques. Thus the areas shown in the figure are schematic in nature and their shapes do not represent the actual shape of the areas of the device and do not limit the scope of the disclosed embodiments.

Referring to FIGS. 1 to 15. It should be noted that, the drawings provided in this embodiment illustrate only schematically the basic concept of the embodiments of the present disclosure. Although only the components related to the embodiment of the present disclosure are shown in the drawings and the drawings are not drawn according to the number, shape and size of the components in actual implementation, the shape, number and proportion of the components in actual implementation may be an arbitrary change, and the layout type of the components may be more complex.

In order to maintain the high integration of the semiconductor memory devices, in the current mainstream DRAM technology, a buried word line is used in the memory cell transistor, which can reduce the short channel effect to a certain extent, and thus reduce the leakage phenomenon of devices.

Figure 2:
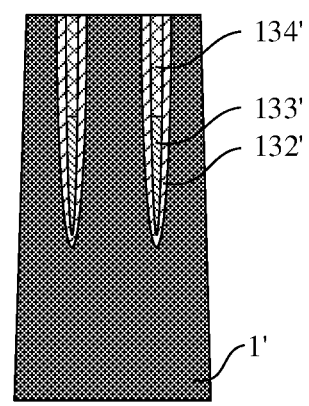
FIG. 2 is a cross-sectional structure diagram of a structure obtained after forming a word line structure in an buried word line process.

In the DRAM buried word line process, as shown in FIG. 1, an island structure is usually formed in the substrate 1' by dry etching; then a chevron trench of the buried word line is formed by dry etching; after that, a thermal oxidation process is performed to form a gate oxide layer 132', and then metal 133' is deposited and the dielectric layer 134' is formed sequentially from bottom to top to form a word line structure, as shown in FIG. 2.

However, as the size of the memory cell decreases, the size of the buried word line trench will also decrease, and then the cross-sectional area of the metal filled in the buried word line trench will also decrease, which will lead to an increase in the resistance of the word line, resulting in more power consumption and aggravating RC delay.

For the deficiencies in the related art, according to some embodiments of the present disclosure, a manufacturing method of a semiconductor structure is provided.

Figure 3:
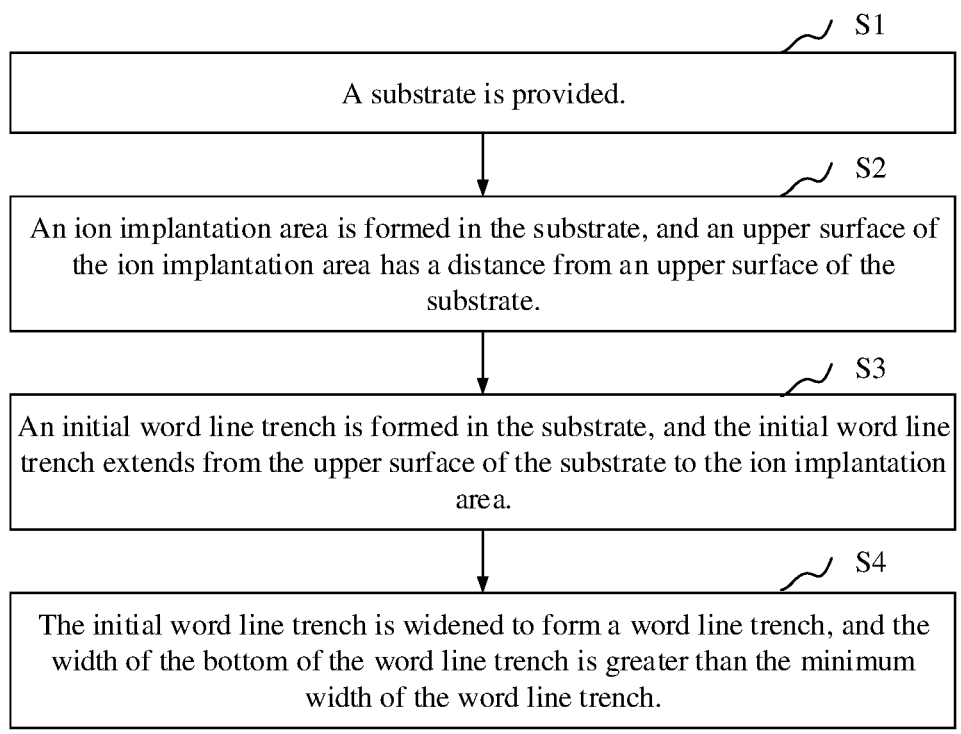
FIG. 3 is a flow chart of a manufacturing method of a semiconductor structure provided by an embodiment of the present disclosure.

Referring to FIG. 3, in one of the embodiments, the manufacturing method may include the following operations.

In S1, a substrate is provided.

In S2, an ion implantation area is formed in the substrate, and an upper surface of the ion implantation area has a distance from an upper surface of the substrate.

In S3, an initial word line trench is formed in the substrate, and the initial word line trench extends from the upper surface of the substrate to the ion implantation area.

In S4, the initial word line trench is widened to form a word line trench, and the width of the bottom of the word line trench is greater than the minimum width of the word line trench.

In the manufacturing method of a semiconductor structure provided by the embodiments of the present disclosure, by forming the ion implantation area in the substrate, it enables the initial word line trench to be widened to form the word line trench after the initial word line trench is formed, thereby increasing the cross-sectional area of the bottom of the formed word line trench, and reducing the resistance of the word line formed in the subsequent manufacturing process, and thus reducing the power consumption of the device and decreasing the RC delay.

The manufacturing method of a semiconductor structure related to the embodiments of the present disclosure will be described in further detail below in combination with FIGS. 4 to 15.

Figure 4:
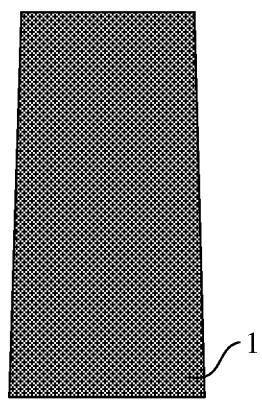
FIG. 4 is a cross-sectional structure diagram of a structure obtained by the operation S1 in the manufacturing method of a semiconductor structure provided by an embodiment of the present disclosure.

In S1, as shown in FIG. 4, the substrate 1 is provided.

In embodiments of the present disclosure, the material of the substrate 1 is not specifically limited. As an example, the substrate 1 may include, but is not limited to, one or more of a silicon substrate, a sapphire substrate, a glass substrate, a silicon carbide substrate, a gallium nitride substrate, a gallium arsenide substrate or the like, that is, the material of the substrate 1 may include but is not limited to one or more of silicon, sapphire, glass, silicon carbide, gallium nitride, gallium arsenide or the like.

In some possible embodiments, prior to S1, the manufacturing method may further include the operation of etching the initial substrate to form the island structure as shown in FIG. 4. Embodiments of the present disclosure do not specifically limit the method for etching the initial substrate; by way of example, the initial substrate may be etched by but not limited to dry etching.

Figure 5:
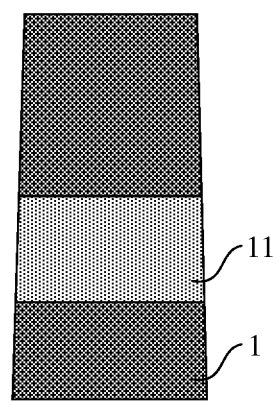
FIG. 5 is a cross-sectional structure diagram of a structure obtained by the operation S2 in the manufacturing method of a semiconductor structure provided by an embodiment of the present disclosure.

In S2, as shown in FIG. 5, an ion implantation area 11 is formed in the substrate 1. Specifically, there is a distance between the upper surface of the ion implantation area 11 and the upper surface of the substrate 1.

In embodiments of the present disclosure, the ion concentration of the ion implantation area 11 is not specifically limited. As an example, the ion concentration of the ion implantation area 11 may be $1\times10^{17}$ per $cm^3$ to $1\times10^{22}$ per $cm^3$; for example, the ion concentration of the ion implantation area 11 may be $1\times10^{17}$ per $cm^3$, $1\times10^{18}$ per $cm^3$, $1\times10^{19}$ per $cm^3$, $1\times10^{20}$ per $cm^3$, $1\times10^{20}$ per $cm^3$ or $1\times10^{22}$ per $cm^3$ or the like.

In embodiments of the present disclosure, the distance between the ion implantation area 11 and the upper surface of the substrate 1 is not specifically limited. As an example, the distance between the ion implantation area 11 and the upper surface of the substrate 1 may be 100 nm to 200 nm; for example the distance between the ion implantation area 11 and the upper surface of the substrate 1 may be 100 nm, 125 nm, 150 nm, 175 nm, or 200 nm.

Figure 6:
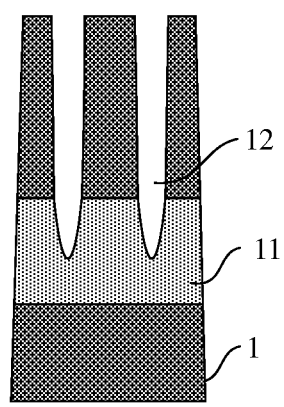
FIG. 6 is a cross-sectional structure diagram of a structure obtained by the operation S4 in the manufacturing method of a semiconductor structure provided by an embodiment of the present disclosure.

In S3, as shown in FIG. 6, an initial word line trench 12 is formed in the substrate 1. Specifically, the initial word line trench 12 extends from the upper surface of the substrate 1 to the ion implantation area 11.

Embodiments of the present disclosure do not specifically limit the method for forming the initial word line trench 12. As an example, the initial word line trench 12 may be formed in the substrate 1 by, but not limited to dry etching.

As an example, the operation of forming the initial word line trench 12 in the silicon substrate may be performed by, for example dry etching the silicon substrate with carbon tetrafluoride ($CF_4$) as an etching gas, in which the carbon tetrafluoride will be dissociated into trifluoromethyl ($CF_3$) and fluorine (F) neutral groups in capacitive coupled plasma (CCP) or inductively coupled plasma (ICP). These fluorine neutral groups have high reactivity due to electron unsaturation, and thus are very easy to react with the silicon substrate to form silicon tetrafluoride ($SiF_4$) with the volatilization characteristic, finally forming the initial word line trench 12.

Embodiments of the present disclosure do not specifically limit the width of the initial word line trench 12. In an embodiment, the width of the initial word line trench 12 formed in S2 may be ⅓ to ⅔ of the width of the word line trench 13 formed in the subsequent process; for example, the width of the initial word line trench 12 formed in S2 may be ⅓, ½ or ⅔ of the width of the word line trench 13 formed in the subsequent process or the like.

At the same time, embodiments of the present disclosure do not specifically limit the depth of the initial word line trench 12. In one of the embodiments, the bottom of the initial word line trench 12 may be located in the ion implantation area 11.

Figure 8:
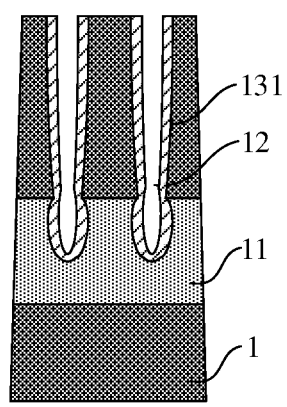
FIG. 8 is a cross-sectional structure diagram of a structure obtained by the operation S401 in the manufacturing method for a semiconductor structure provided by an embodiment of the present disclosure.
Figure 9:
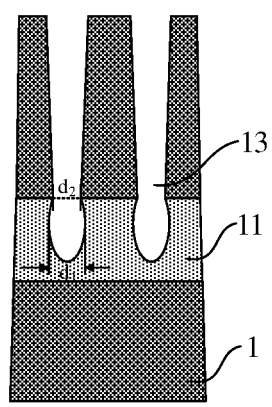
FIG. 9 is a cross-sectional structure diagram of a structure obtained by the operation S402 in the manufacturing method of a semiconductor structure provided by an embodiment of the present disclosure.

In S4, in conjunction with FIGS. 8 to 9, the initial word line trench 12 is widened to form the word line trench 13. Specifically, the width d1 of the bottom of the word line trench 13 should be greater than the minimum width d2 of the word line trench 13. In some embodiments, the minimum width of the word line trench 13 may also be the width of the upper part of the word line trench 13 (the area above the bottom of the word line trench 13), for example, the upper part of the word line trench 13 is rectangular.

Figure 7:
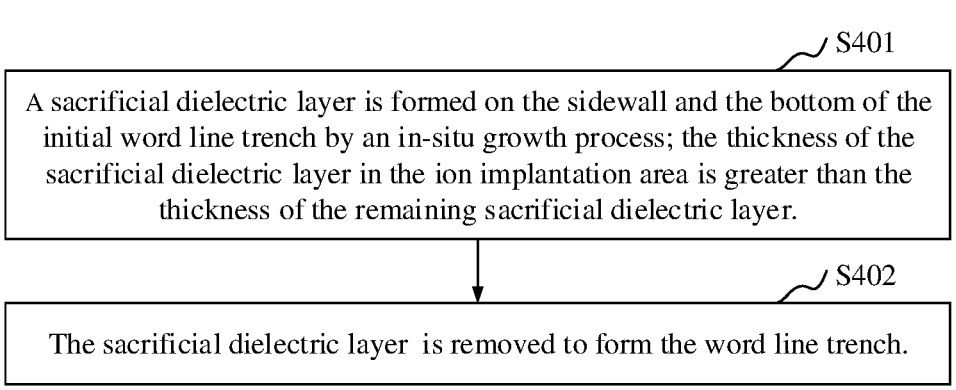
FIG. 7 is a flow chart of the operation S4 in the manufacturing method of a semiconductor structure provided by an embodiment of the present disclosure.

In embodiments of the present disclosure, the method for widening the initial word line trench 12 is not specifically limited. Referring to FIG. 7, in one of the embodiments, S4 may include the following operations.

In S401, as shown in FIG. 8, a sacrificial dielectric layer 131 is formed on the sidewall and the bottom of the initial word line trench 12 by an in-situ growth process; specifically, the thickness of the sacrificial dielectric layer 131 in the ion implantation area 11 should be greater than the thickness of the remaining sacrificial dielectric layer 131.

In S402, as shown in FIG. 9, the sacrificial dielectric layer 131 is removed to form the word line trench 13.

In S401, in embodiments of the present disclosure, the method of the in-situ growth process for forming the sacrificial dielectric layer 131 is not specifically limited.

It can be understood that when the substrate 1 includes a silicon substrate, after the initial word line trench 12 is formed by etching, the exposed sidewall and bottom of the initial word line trench 12 should include silicon (Si). As an example, the operation of forming the sacrificial dielectric layer 131 on the sidewall and the bottom of the initial word line trench 12 may be performed as follows, for example, the exposed silicon after etching is oxidized to silicon dioxide ($SiO_2$) by thermal oxidation (e.g. dry oxygen oxidation or wet oxygen oxidation) process to form the sacrificial dielectric layer 131.

Since silicon in the initial word line trench 12 in the ion implantation area 11 has a faster reaction rate, more silicon can be consumed, so that the thickness of the sacrificial dielectric layer 131 formed in the ion implantation area 11 is greater than the thickness of the remaining sacrificial dielectric layer 131.

In embodiments of the present disclosure, the type of ions implanted in the ion implantation area 11 is not specifically limited. As an example, the ion implantation area 11 may be formed by implanting fluorine ions into the substrate 1. Implanting fluorine ions into the substrate 1 can reduce the activation energy of silicon and oxygen (O) elements, and form Si—F bonds with lower activity than Si—Si bonds, that is, Si—F bonds are more easily broken, that is, oxygen is easier to break Si—F bonds to forms Si—O bonds. Thus, the formed ion implantation area 11 has a faster oxidation rate, which can consume more silicon, and helps to promote the formation of a thicker sacrificial dielectric layer 131.

As an example, the operation of implanting fluorine ions into the substrate 1 to form the ion implantation area 11 may be performed as follows. For example, boron trifluoride ($BF_3$) is used as an ion source, and accelerated into a mass analyzer by an electric field after being ionized. Fluoride ions (F+ or F++) are sorted out by the magnetic field of the mass analyzer, the energy of fluoride ion is allowed to reach 120 KeV through the accelerator, and the ion implantation area 11 with doped concentration being $1\times10^{17}$ per $cm^3$ to $1\times10^{22}$ per $cm^3$ in an area with a depth of 100 nm to 200 nm from the upper surface of the substrate 1 is formed.

In S402, in embodiments of the present disclosure, the method for removing the sacrificial dielectric layer 131 is not specifically limited. As an example, the sacrificial dielectric layer 131 may be removed by but not limited to wet etching.

Meanwhile, in embodiments of the present disclosure, the type of wet etching solution used in S402 is not specifically limited. As an example, the sacrificial dielectric layer 131 may be completely removed by using but not limited to diluted hydrofluoric acid (DHF) or buffered oxide etch (BOE).

Figure 10:
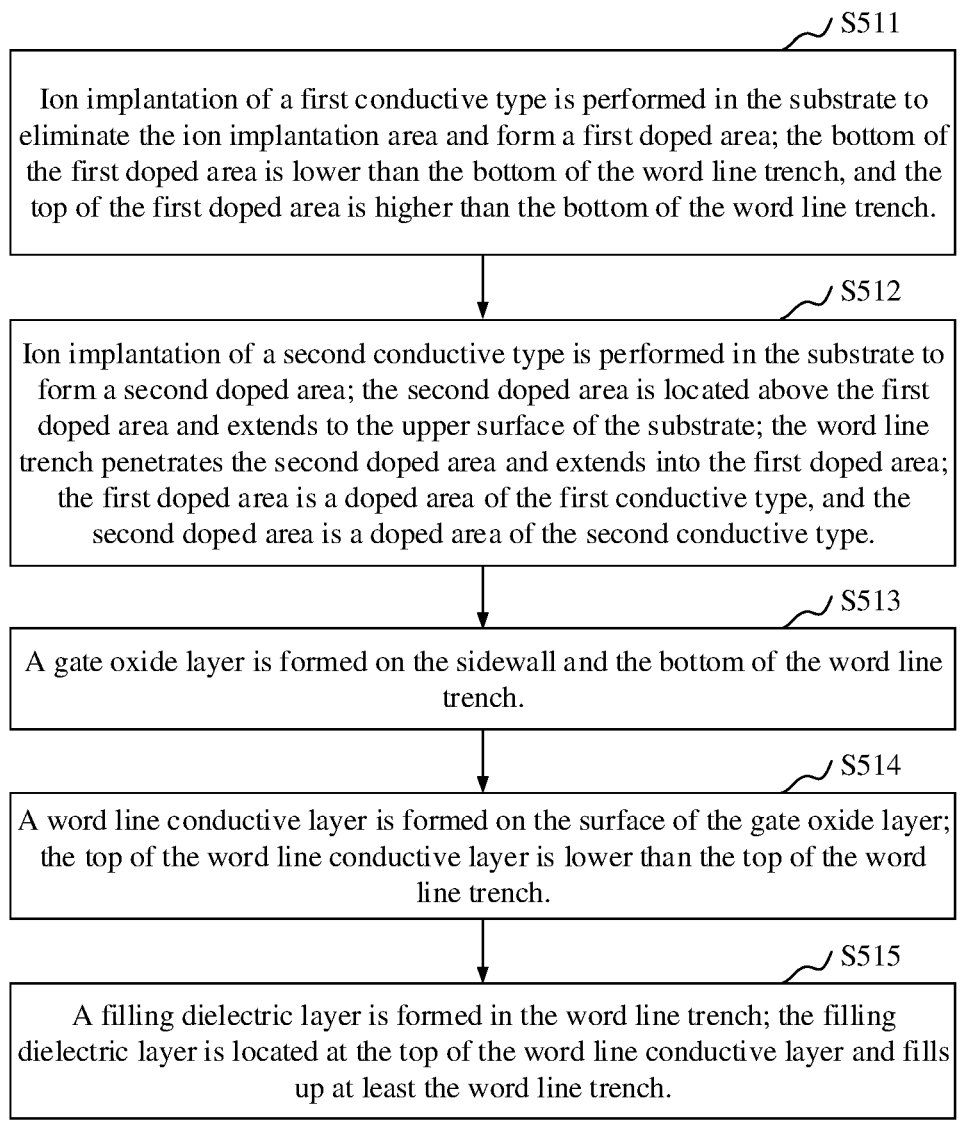
FIG. 10 is a flow chart after forming the word line trench in a manufacturing method of a semiconductor structure provided by an embodiment of the present disclosure.

Referring to FIG. 10, in one of the embodiments, after the word line trench 13 is formed, the manufacturing method may include the following operations.

In S511, ion implantation of a first conductive type is performed in the substrate 1 to eliminate the ion implantation area 11 and form a first doped area 141; specifically, the bottom of the first doped area 141 should be lower than the bottom of the word line trench 13, and the top of the first doped area 141 should be higher than the bottom of the word line trench 13.

Figure 11:
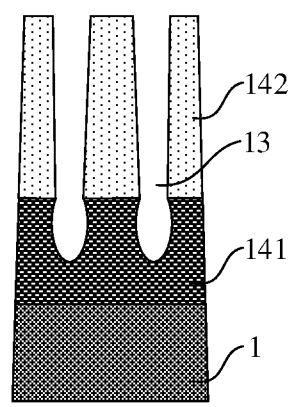
FIG. 11 is a cross-sectional structure diagram of a structure obtained by the operation S512 in the manufacturing method of a semiconductor structure provided by an embodiment of the present disclosure.

In S512, ion implantation of a second conductive type is performed in the substrate 1 to form a second doped area 142; specifically, as shown in FIG. 11, the second doped area 142 should be located above the first doped area 141 and extend to the upper surface of the substrate 1; meanwhile, the word line trench 13 should penetrate the second doped area 142 and extend into the first doped area 141; the first doped area 141 is a doped area of the first conductive type, and the second doped area 142 is a doped area of the second conductive type.

Figure 12:
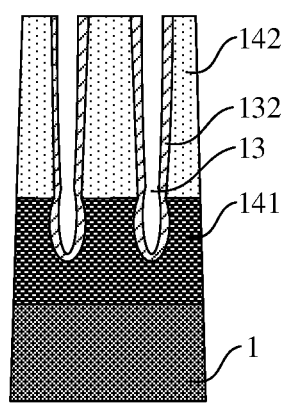
FIG. 12 is a cross-sectional structure diagram of a structure obtained by the operation S513 in the manufacturing method of a semiconductor structure provided by an embodiment of the present disclosure.

In S513, as shown in FIG. 12, a gate oxide layer 132 is formed on the sidewall and the bottom of the word line trench 13.

In S514, a word line conductive layer 133 is formed on the surface of the gate oxide layer 132; specifically, the top of the word line conductive layer 133 should be lower than the top of the word line trench 13.

Figure 13:
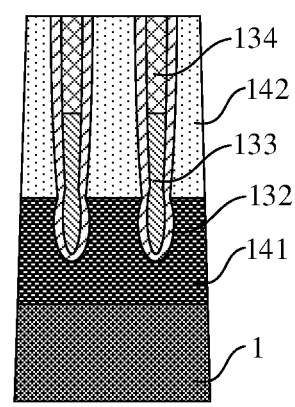
FIG. 13 is a cross-sectional structure diagram of a structure obtained by the operation S515 in the manufacturing method of a semiconductor structure provided by an embodiment of the present disclosure.

In S515, a filling dielectric layer 134 is formed in the word line trench 13; specifically, as shown in FIG. 13, the filling dielectric layer 134 should be located at the top of the word line conductive layer 133 and fill up at least the word line trench 13.

Embodiments of the present disclosure do not specifically limit the method for forming the gate oxide layer 132. As an example, the gate oxide layer 132 may be formed on the sidewall and the bottom of the word line trench 13 by any one of but not limited to free radical oxidation, physical vapor deposition (PVD), chemical vapor deposition (CVD), flowable chemical vapor deposition (FCVD), high density plasma deposition (HDP), plasma enhanced deposition or atomic layer deposition, or the like.

At the same time, embodiments of the present disclosure do not specifically limit the material of the gate oxide layer 132. As an example, the gate oxide layer 132 may include but is not limited to one or more of a silicon dioxide layer, a high-k dielectric material layer, or other dielectric material layer; that is, the material of the gate oxide layer 132 may include but is not limited to one or more of silicon dioxide, high-K dielectric materials, or other dielectric materials.

As an example, the gate oxide layer 132 may be formed using free radical oxidation process at 850° C. to 1050° C.; for example, the gate oxide layer 132 may be formed by free radical oxidation process at 850° C., 900° C., 950° C., 1000° C., 1050° C. or the like. Oxygen neutral radical group (O*) or hydrogen oxygen neutral radical group (OH*) is an intermediate product during forming water with hydrogen ($H_2$) and oxygen ($O_2$), which has stronger chemical activity because of the unsaturated extranuclear electron. Free radicals can break weaker chemical bonds and then stronger chemical bonds are formed, and thus the gate oxide layer 132 with a higher quality can be obtained.

As an example, during forming the gate oxide layer 132 by free radical oxidation process, the reaction pressure can be controlled within 20 Torr, and the low pressure allows a longer mean free path of gas molecules, so that a longer free radical lifetime can be obtained.

In embodiments of the present disclosure, the method for forming the word line conductive layer 133 is not specifically limited. As an example, the word line conductive layer 133 is formed on the surface of the gate oxide layer 132 by, but not limited to one or more of chemical vapor deposition, physical vapor deposition, flowable chemical vapor deposition, high density plasma deposition, plasma enhanced deposition, atomic layer deposition, or the like.

As an example, the operation for forming the word line conductive layer 133 on the surface of the gate oxide layer 132 may be performed as follows. For example, a word line conductive material layer is formed on the surface of the gate oxide layer 132, and part of the word line conductive material layer is etched back to form the word line conductive layer 133.

At the same time, in embodiments of the present disclosure, the material of the word line conductive layer 133 is not specifically limited. As an example, the material of the word line conductive layer 133 may include, but is not limited to, one or more of titanium nitride (TiN), titanium (Ti), tungsten silicide ($Si_2W$), tungsten (W), or the like.

As an example, the operation of forming the word line conductive layer 133 on the surface of the gate oxide layer 132 may also be performed as follows. For example, tungsten is deposited to form a word line conductive material layer using a chemical vapor deposition process with better step coverage, in which the reactant gas may include, but is not limited to, silane ($SiH_4$) and tungsten hexafluoride ($WF_6$). Then the word line conductive material layer is etched back by dry etching, in which the etching gas may be, but is not limited to, sulfur hexafluoride.

In embodiments of the present disclosure, the method for forming the filling dielectric layer 134 is not specifically limited. As an example, the filling dielectric layer 134 may be formed in the word line trench 13 by, but not limited to any one of chemical vapor deposition or physical vapor deposition.

At the same time, in embodiments of the present disclosure, the material of the filling dielectric layer 134 is not specifically limited. As an example, the material of the filling dielectric layer 134 may include, but is not limited to, one or more of silicon dioxide, silicon nitride ($Si_3N_4$), silicon oxynitride (SiON), or the like.

As an example, the operation of forming the filling dielectric layer 134 in the word line trench 13 may be performed as follows. For example, chemical vapor deposition is used to form silicon nitride as a filling dielectric material layer by the reaction between hexachlorodisilane ($Si_2Cl_6$, HCD) or dichlorosilane ($SiH_2Cl_2$, DCS) and ammonia ($NH_3$), and then chemical mechanical polishing (CMP) is performed to form the filling dielectric layer 134.

In the embodiments of the disclosure, the first conductive type is P-type, while the second conductive type is N-type.

As an example, the operation of forming the first doped area 141 of P-type may be performed as follows. For example, the first doped area 141 of P-type doped with boron ions is formed by ion implantation using boron ions (B+) generated by ionization of boron trifluoride as an ion source.

As an example, the operation of forming the second doped area 142 of N-type may be performed as follows. For example, the second doped area 142 of N-type doped with phosphorus ions is formed above the first doped area 141 by ion implantation using phosphorus ions (P+) generated by ionization of phosphorus (P) vapor as an ion source.

Embodiments of the present disclosure do not specifically limit the ion concentration of the first doped area 141 and the ion concentration of the second doped area 142. As an example, the ion concentration of the first doped area 141 may be $1\times10^{16}$ per $cm^3$ to $1\times10^{20}$ per $cm^3$; for example, the ion concentration of the first doped area 141 may be $1\times10^{16}$ per $cm^3$, $1\times10^{17}$ per $cm^3$, $1\times10^{18}$ per $cm^3$, $1\times10^{19}$ per $cm^3$, $1\times10^{20}$ per $cm^3$, or the like. As an example, the ion concentration of the second doped area 142 may be $1\times10^{16}$ per $cm^3$ to $1\times10^{20}$ per $cm^3$; for example, the ion concentration of the second doped area 142 may be $1\times10^{16}$ per $cm^3$, $1\times10^{17}$ per $cm^3$, $1\times10^{18}$ per $cm^3$, $1\times10^{19}$ per $cm^3$, $1\times10^{20}$ per $cm^3$ or the like.

As an example, the ion implantation area 11 may also be formed by implanting boron (B) ions into the substrate 1. When the substrate 1 is implanted with boron ions to form the ion implantation area 11, the ion implantation area may be reused as the first doped area 141. On this basis, before the ion implantation area 11 (also the first doped area 141 in this embodiment) is formed in the substrate 1, the manufacturing method may further include the operation of forming the second doped area 142 in the substrate 1.

Figure 14:
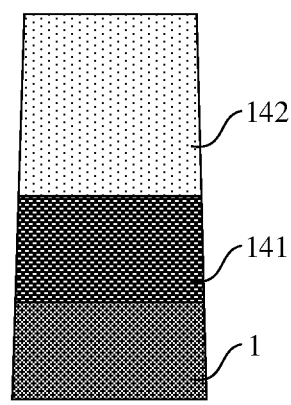
FIG. 14 is a cross-sectional structure diagram of a structure obtained by forming a second doped area in the substrate in the manufacturing method of a semiconductor structure provided by an embodiment of the present disclosure.

Specifically, as shown in FIG. 14, the second doped area 142 should be located above the first doped area 141 and extend to the upper surface of the substrate 1.

It should be noted that, as for the method for forming the first doped area 141 and the second doped area 142, reference can be made to the above and descriptions will not be repeated here.

Figure 15:
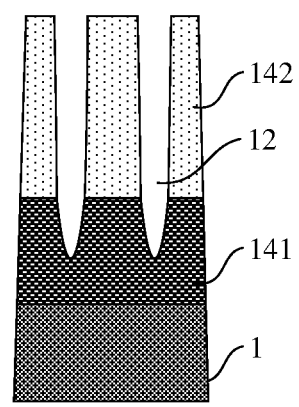
FIG. 15 is a cross-sectional structure diagram of a structure obtained by the operation S3 in the manufacturing method of a semiconductor structure provided by another embodiment of the present disclosure.

At this time, the structure obtained in S3 may be as shown in FIG. 15, in which the initial word line trench 12 penetrates the second doped area 142 and extends into the first doped area 141; the first doped area 141 is a doped area of the first conductive type, and the second doped area 142 is a doped area of the second conductive type.

It should be noted that, as for the method for forming the initial word line trench 12, reference can be made to the above and descriptions will not be repeated here. In some embodiments, the width of the upper part of the initial word line trench 12 is, for example, less than ½ of the width of the upper part of the word line trench 13. If the width of the upper part of the initial word line trench 12 is relatively large, the width of the upper part of the initial word line trench 12 becomes larger during the subsequent widening process, such that the space between adjacent word line trenches 13 is relatively small, which is not conducive to the subsequent manufacture of bit line contact pad that is located between word line trenches 13. Because of the small space between the word line trenches 13, it is possible to cause the bit line contact pad to be connected with the word line trench 13, that is, the bit line is directly connected with the word line, thus affecting the performance of the memory.

In one of the embodiments of the disclosure, the first conductive type is P-type, while the second conductive type should be N-type.

In one of the embodiments, S4 may also include the following operations.

The initial word line trench 12 (shown in FIG. 6) is wet etched using a wet etching solution to obtain a word line trench 13; referring to FIG. 11, FIG. 11 is also a schematic cross-sectional structure diagram of the structure obtained after the word line trench 13 is obtained in this embodiment.

Specifically, the etching rate of the wet etching solution for part of the initial word line trench 12 in the first doped area 141 should be greater than the etching rate the wet etching solution for part of the initial word line trench 12 in the second doped area 142, so that the width of the bottom of the formed word line trench 13 can be greater than the minimum width of the word line trench 13.

In embodiments of the present disclosure, the type of the wet etching solution is not specifically limited. As an example, the wet etching solution may include, but is not limited to the mixture of ammonia and hydrogen peroxide ($H_2O_2$).

During wet etching the initial word line trench 12, because the hole concentration of the first doped area 141 is much higher than that of the second doped area 142 located above it, peroxyhydrogen ion ($HO^{2-}$) formed after ionization of hydrogen peroxide is more likely to combine with silicon on the surface of the first doped area 141 where the hole concentration is higher, and reaction occurs to form silicon dioxide, then silicon dioxide reacts with hydroxide ion ($OH^-$) in the solution to form silicate ions ($SiO_3^{2-}$) and dissolve into the solution. Therefore, the wet etching rate of the first doped area 141 is faster, which can consume more silicon, while the wet etching rate of the second doped area 142 above the first doped area 141 is slower, which consumes less silicon. In this way, the bottom of the formed word line trench 13 is relatively wide.

Referring to FIGS. 12 to 13, in an embodiment, after wet etching the initial word line trench 12 by using a wet etching solution to obtain the word line trench 13, the manufacturing method may further include the following operations.

A gate oxide layer 132 is formed on the sidewall and bottom of the word line trench 13 as shown in FIG. 12; a word line conductive layer 133 is formed on the surface of the gate oxide layer 132, in which the top of the word line conductive layer 133 is lower than the top of the word line trench 13; A filling dielectric layer 134 is formed in the word line trench 13, in which the filling dielectric layer 134 is located on the top of the word line conductive layer 133 and at least fills up the word line trench 13, as shown in FIG. 13.

It should be noted that the methods for forming the gate oxide layer 132, the word line conductive layer 133 and the filling dielectric layer 134 can be referred to the above mentioned contents and will not be repeated here.

It should be understood that although the various operations in the flowcharts of FIGS. 3, 7, and 10 are shown in sequence as indicated by the arrows, these operations are not necessarily executed in sequence as indicated by the arrows. Unless explicitly stated herein, there are no strict sequential restrictions on the execution of these operations, and these operations can be performed in other sequences. Further, at least a part of the operations in FIGS. 3, 7 and 10 may include a plurality of operations or stages, these operations or stages are not necessarily executed at the same time, but may be executed at different times, and the execution sequence of these operations or stages is not necessarily sequential, but may be executed in turn or alternately with other operations or at least a part of the operations or stages in other operations.

According to some embodiments, embodiments of the present disclosure also provide a semiconductor structure.

Continuously referring to FIG. 13, in one of the embodiments, the semiconductor structure may include a substrate 1 and a word line trench 13.

A first doped area 141 and a second doped area 142 is provided in the substrate 1, in which the second doped area 142 extends from the upper surface of the substrate 1 to the substrate 1; the first doped area 141 is located below the second doped area 142; specifically, the first doped area 141 may be a doped area of a first conductive type, and the second doped area 142 may be a doped area of a second conductive type.

The word line trench 13 penetrates the second doped area 142 and extends into the first doped area 141; specifically, the width of the bottom of the word line trench 13 should be greater than the minimum width of the word line trench 13.

The semiconductor structure of the embodiments of the present disclosure has the word line trench 143 with a larger bottom cross-sectional area, which can reduce the resistance of the word line formed in the subsequent manufacturing process, and reduce the device power consumption and decrease the RC delay.

Embodiments of the present disclosure do not limit the distance between the first doped area 141 and the upper surface of the substrate 1. As an example, the distance between the first doped area 141 and the upper surface of the substrate 1 may be 100 nm to 200 nm; for example, the distance between the first doped area 141 and the upper surface of the substrate 1 may be 100 nm, 125 nm, 150 nm, 175 nm, or 200 nm.

Continuously referring to FIG. 13, in one of the embodiments, the semiconductor structure may further include a gate oxide layer 132, a word line conductive layer 133 and a filling dielectric layer 134.

Specifically, the gate oxide layer 132 is located on the sidewall and bottom of the word line trench 13; the word line conductive layer 133 is formed on the surface of the gate oxide layer 132, and the top of the word line conductive layer 133 is lower than the top of the word line trench 13; the filling dielectric layer 134 is located on the top of the word line conductive layer 133, and at least fills up the word line trench 13.

It should be noted that the manufacturing methods in the embodiments of the present disclosure can be used to manufacture the corresponding semiconductor structures, so that the technical features of the method embodiments and the structure embodiments can be replaced and supplemented with each other without conflict, to allow those skilled in the art to learn the technical contents of the embodiments of the present disclosure.

Embodiments in this specification are described in a progressive manner and each embodiment focuses on differences from other embodiments. As for the same and similar parts in some embodiment(s), reference can be made to other embodiment(s).

The technical features of the above-described embodiments may be arbitrarily combined, and in order to describe concisely, not all possible combinations of the technical features of the above-described embodiments are described. However, as long as there is no contradiction in the combinations of these technical features, they should be considered as belonging to the scope described in this specification.

The above-mentioned embodiments only represent several implementations of the embodiments of the present disclosure, and the descriptions thereof are relatively specific and detailed, but should not be construed as a limitation on the scope of the application. It should be noted that those skilled in the art can further make several improvements and modifications without departing from the concept of the present disclosure, which fall within the scope of protection of the present disclosure. Therefore, the scope of protection of the embodiments of the present disclosure shall be subject to the scope of protection of the claims.

The invention claimed is:

1. A manufacturing method of a semiconductor structure, comprising:
   providing a substrate;
   forming an ion implantation area in the substrate, an upper surface of the ion implantation area having a distance from an upper surface of the substrate;
   forming an initial word line trench in the substrate, the initial word line trench extending from the upper surface of the substrate into the ion implantation area; and
   widening the initial word line trench to form a word line trench, a width of a bottom of the word line trench being greater than a minimum width of the word line trench;
   wherein a width of an upper part of the initial word line trench is less than ½ of a width of an upper part of the word line trench.

2. The manufacturing method of a semiconductor structure according to claim 1, wherein, fluorine ions or boron ions are implanted into the substrate to form the ion implantation area.

3. The manufacturing method of a semiconductor structure according to claim 2, wherein, an ion concentration of the ion implantation area is $1\times10^{17}$ per $cm^3$ to $1\times10^{22}$ per $cm^3$; and
   the distance between the upper surface of the ion implantation area and the upper surface of the substrate is 100 nm to 200 nm.

4. The manufacturing method of a semiconductor structure according to claim 1, wherein, widening the initial word line trench to form the word line trench comprises:
   forming a sacrificial dielectric layer on a sidewall and a bottom of the initial word line trench by an in-situ growth process, a thickness of the sacrificial dielectric layer located in the ion implantation area being greater than a thickness of the sacrificial dielectric layer not located in the ion implantation area; and removing the sacrificial dielectric layer to form the word line trench.

5. The manufacturing method of a semiconductor structure according to claim 1, wherein, after the word line trench is formed, the manufacturing method of a semiconductor structure further comprises:

performing ion implantation of a first conductive type in the substrate to adjust an ion concentration in the ion implantation area and form a first doped area, a bottom of the first doped area being lower than a bottom of the word line trench, and a top of the first doped area being higher than the bottom of the word line trench;

performing ion implantation of a second conductive type in the substrate to form a second doped area, the second doped area being located above the first doped area and extending to the upper surface of the substrate, the word line trench penetrating the second doped area and extending into the first doped area, the first doped area being a doped area of the first conductive type, and the second doped area being a doped area of the second conductive type;

forming a gate oxide layer on a sidewall and the bottom of the word line trench;

forming a word line conductive layer on a surface of the gate oxide layer, a top of the word line conductive layer being lower than a top of the word line trench; and forming a filling dielectric layer in the word line trench, the filling dielectric layer being located on the top of the word line conductive layer and at least filling up the word line trench.

6. The manufacturing method of a semiconductor structure according to claim 5, wherein, the first conductive type is P-type; and the second conductive type is N-type.

7. The manufacturing method of a semiconductor structure according to claim 5, wherein, an ion concentration in the first doped area is $1\times10^{16}$ per cm$^3$ to $1\times10^{20}$ per cm$^3$; and an ion concentration in the second doped area is $1\times10^{16}$ per cm$^3$ to $1\times10^{20}$ per cm$^3$.

8. The manufacturing method of a semiconductor structure according to claim 1, wherein, the ion implantation area is a first doped area; and before the ion implantation area is formed in the substrate, the manufacturing method of a semiconductor structure further comprises:

forming a second doped area in the substrate, the second doped area being located above the first doped area and extending to the upper surface of the substrate, the initial word line trench penetrating the second doped area and extending into the first doped area, the first doped area being a doped area of a first conductive type, and the second doped area being a doped area of a second conductive type.

9. The manufacturing method of a semiconductor structure according to claim 8, wherein, widening the initial word line trench to form the word line trench comprises:

wet etching the initial word line trench with a wet etching solution to obtain the word line trench, an etching rate of the wet etching solution to a part of the initial word line trench in the first doped area being greater than an etching rate of the wet etching solution to a part of the initial word line trench in the second doped area.

10. The manufacturing method of a semiconductor structure according to claim 9, wherein, the first conductive type is P-type, the second conductive type is N-type, and the wet etch solution comprises a mixture of ammonia water and hydrogen peroxide.

11. The manufacturing method of a semiconductor structure according to claim 8, wherein, an ion concentration in the first doped area is $1\times10^{16}$ per cm$^3$ to $1\times10^{20}$ per cm$^3$, and an ion concentration in the second doped area is $1\times10^{16}$ per cm$^3$ to $1\times10^{20}$ per cm$^3$; and the distance between the upper surface of the first doped area and the upper surface of the substrate is 100 nm to 200 nm.

12. The manufacturing method of a semiconductor structure according to claim 8, wherein, after the word line trench is formed, the manufacturing method of a semiconductor structure further comprises:

forming a gate oxide layer on a sidewall and a bottom of the word line trench;

forming a word line conductive layer on a surface of the gate oxide layer, a top of the word line conductive layer being lower than a top of the word line trench; and forming a filling dielectric layer in the word line trench, the filling dielectric layer being located on the top of the word line conductive layer and at least filling up the word line trench.

13. The manufacturing method of a semiconductor structure according to claim 9, wherein, a hole concentration of the first doped area is higher than a hole concentration of the second doped area.

\* \* \* \* \*